United States Patent
Prather et al.

(10) Patent No.: US 7,173,453 B2
(45) Date of Patent: Feb. 6, 2007

(54) METHOD AND CIRCUIT FOR TRANSLATING A DIFFERENTIAL SIGNAL TO COMPLEMENTARY CMOS LEVELS

(75) Inventors: Stephen M. Prather, Austin, TX (US); Matthew S. Berzins, Cedar Park, TX (US); Jeffrey W. Waldrip, Austin, TX (US)

(73) Assignee: Cypress Semiconductor Corp., San Jose, CA (US)

(*) Notice: Subject to any disclaimer, the term of this patent is extended or adjusted under 35 U.S.C. 154(b) by 82 days.

(21) Appl. No.: 11/015,059

(22) Filed: Dec. 17, 2004

(65) Prior Publication Data

US 2005/0134314 A1 Jun. 23, 2005

Related U.S. Application Data

(60) Provisional application No. 60/531,527, filed on Dec. 18, 2003.

(51) Int. Cl.
*H03K 19/0175* (2006.01)

(52) U.S. Cl. .......................... 326/80; 326/81; 326/63; 326/68

(58) Field of Classification Search ............ 326/62–78, 326/80–81; 327/333
See application file for complete search history.

(56) References Cited

U.S. PATENT DOCUMENTS

| 5,606,268 A * | 2/1997 | Van Brunt ................... 326/68 |
| 6,512,407 B2 * | 1/2003 | Horan et al. ................. 327/333 |

* cited by examiner

*Primary Examiner*—Anh Q. Tran
(74) *Attorney, Agent, or Firm*—Marger Johnson & McCollom P.C.

(57) ABSTRACT

A circuit according to some embodiments of the invention includes a first differential to single ended translator having a first output, a second differential to single ended translator having a second output, and a latch coupled to the first output and the second output, where the latch is configured to select the slower of the first output and the second output.

19 Claims, 4 Drawing Sheets

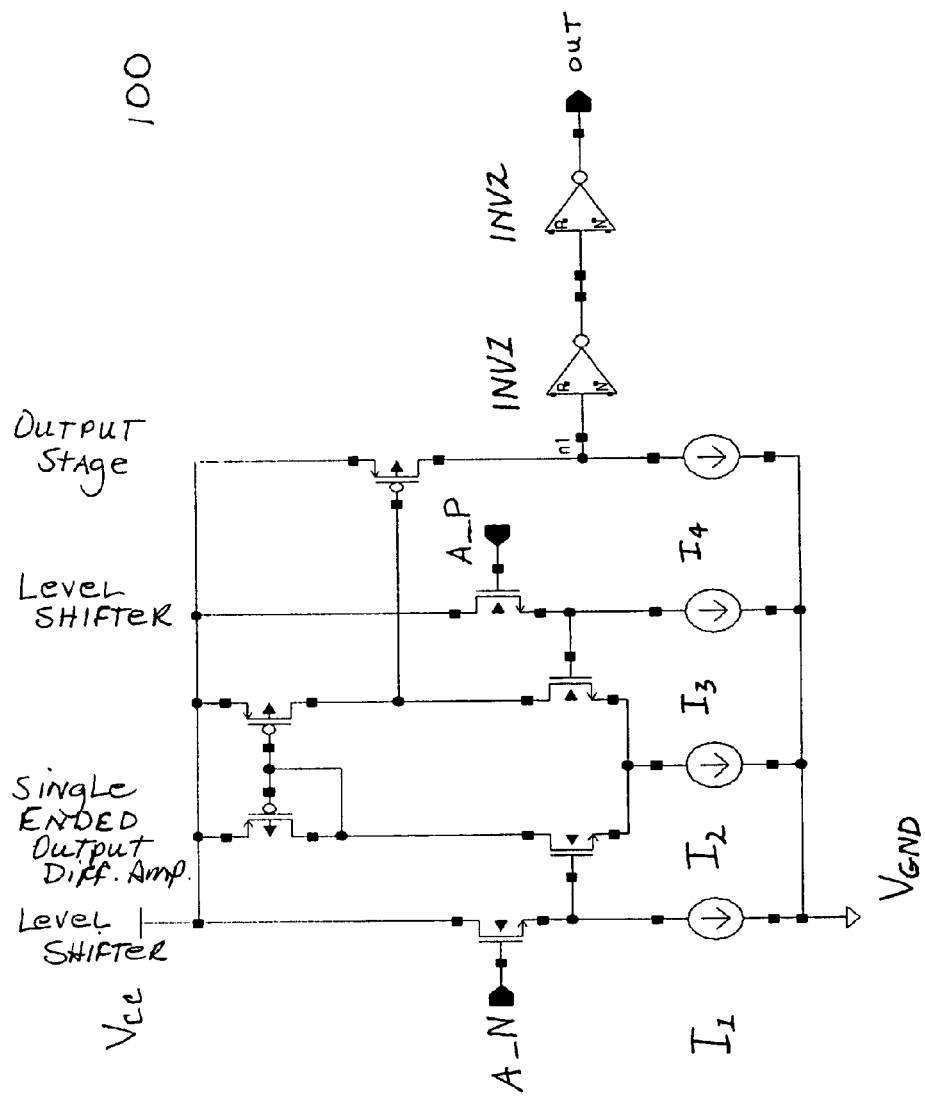
FIG. 1
(Conventional)

ns) METHOD AND CIRCUIT FOR TRANSLATING A DIFFERENTIAL SIGNAL TO COMPLEMENTARY CMOS LEVELS

CROSS REFERENCE TO RELATED APPLICATIONS

This application claims priority from U.S. provisional patent application Ser. No. 60/531,527 filed on 18 Dec. 2003, entitled Method and Circuit for Translating a Differential Signal to Complementary CMOS Levels, which is hereby incorporated by reference in its entirety for all purposes.

BACKGROUND OF THE INVENTION

1. Technical Field of the Invention

This disclosure relates generally to electronic circuits, and in particular to circuits for level translation.

2. Description of the Related Art

Level translation moves a signal from a first signaling voltage swing domain to a second domain. This translation is usually from a low-swing domain to a high-swing domain.

A common conventional solution for translating differential signals (usually at a lower voltage level) to complementary metal oxide silicon (CMOS) signals (usually at a higher voltage level) is to use a differential amplifier with a single ended output driving a trip-point skewed inverter.

FIG. 1 is a circuit diagram illustrating a conventional level translator circuit 100 that implements the conventional solution described above. The conventional level translator circuit 100 includes several circuit stages connected between a supply voltage $V_{CC}$ and a ground voltage $V_{GND}$. The level translator circuit 100 includes two level shifters, an output stage, and a single ended output differential amplifier stage. Each stage has its own current source $I_1$, $I_2$, $I_3$, $I_4$ that sinks current into the ground node.

Differential inputs are applied at the inputs A_N and A_P of the level shifters. In one instance, the differential signal may be a USB 2.0 signal. The USB interface is described as version 2.0 "Universal Serial Bus Revision 2.0 specification," which is available at the USB website 'http://www.usb.org/developers/docs/'.

The output stage includes first and second inverters INV1 and INV2. A CMOS output OUT is obtained from the second inverter INV2.

The conventional level translator circuit 100 has several disadvantages. Although the level translator circuit 100 and other conventional circuits like it may be adjusted to work perfectly at any one process, voltage, and temperature (PVT), the duty cycle distortion (DCD) when measured across all conditions is terrible, in some cases approximately 35/65 (50/50 is the desired DCD). The output stage does not operate in its linear region, so the rise and fall times at the circuit node n1 varies significantly with process, voltage, and temperature (PVT). Thus, the trip point of the first inverter INV1 will vary widely with PVT. Also, the trip point of the first inverter INV1 is generally skewed upwards, which causes the rise time to become faster than the fail time. This variance increases over PVT compared to a balanced inverter.

The disparity described above distorts the CMOS output when compared to the differential input, and the narrowest input bit widths will have the output width reduced by the amount that the rise and fall delays differ. Consequently, the conventional level translator circuit 100 exhibits a widely varying delay disparity for 0-to-1 (low to high) and 1-to-0 (high to low) transitions across all operating conditions. For example, a 1.2 ns input width may be reduced to 1.0 ns at the output, which may not be acceptable for some implementations. It would be desirable to have a level translation circuit that had a much smaller delay disparity between high-to-low and low-to-high transitions.

Embodiments of the invention address these and other disadvantages of the conventional art.

SUMMARY OF THE INVENTION

Some embodiments of the invention provide a method for accurately translating a differential signal into a complementary CMOS signal. Other embodiments of the invention provide a circuit for accurately translating a differential signal into a complementary CMOS signal.

BRIEF DESCRIPTION OF THE DRAWINGS

FIG. 1 is a circuit diagram illustrating a conventional level translator circuit.

DETAILED DESCRIPTION OF THE INVENTION

Figure 2:
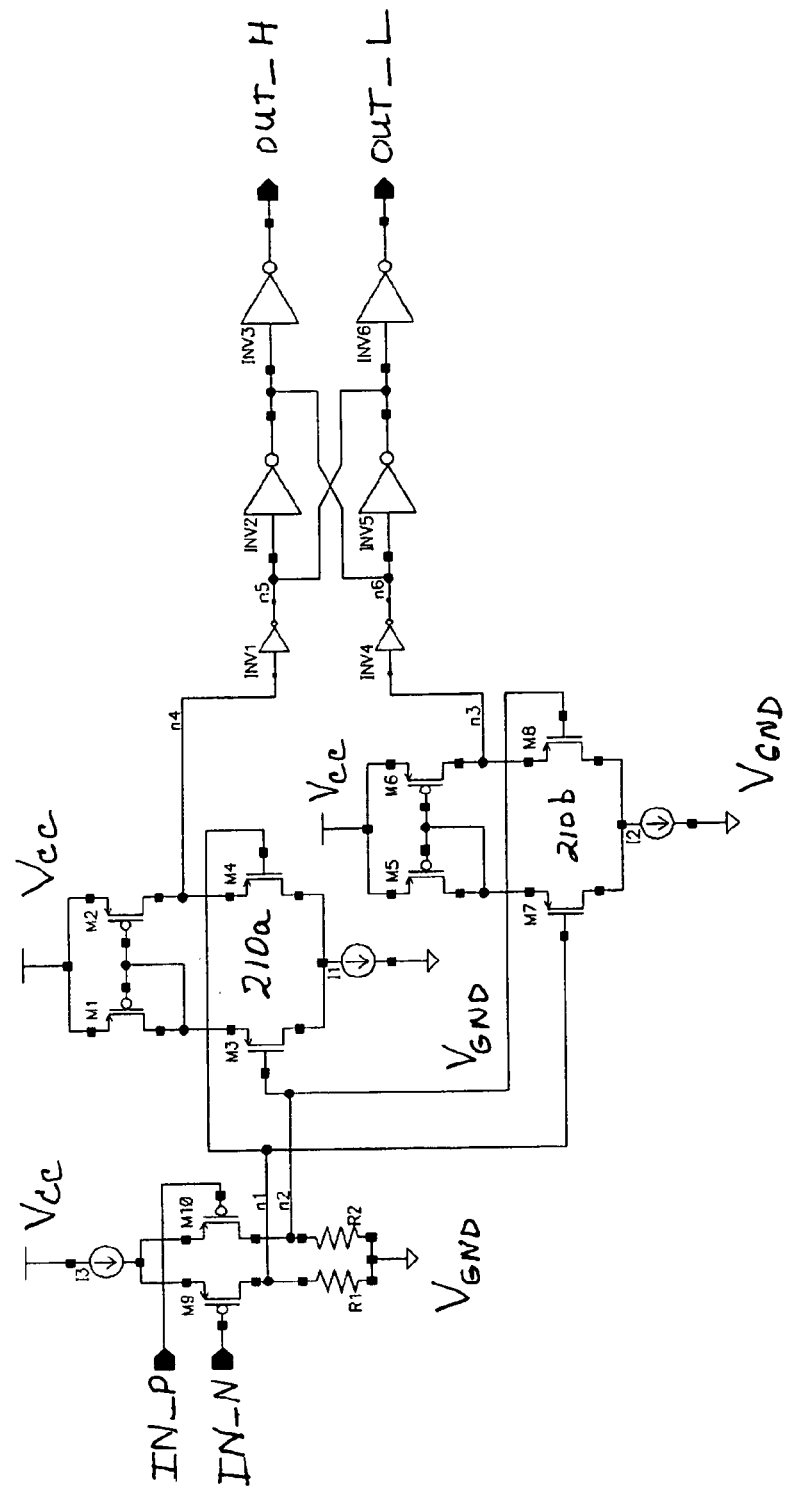
FIG. 2 is a circuit diagram illustrating an improved level translator circuit according to some embodiments of the invention.

FIG. 2 is a circuit diagram illustrating an improved level translator circuit 200 according to some embodiments of the invention. The improved level translator circuit 200 includes a buffer section 205, a differential to single ended section 210, and a delay equalizing latch section 215.

The buffer section includes a current source 13, two PMOS transistors M9 and M10, and two resistors R1 and R2. Each of the transistors M9, M10 is serially connected with one of the resistors R1, R2. It is preferable that the transistors M9, M10 be relatively well-matched devices in order to effectively eliminate common mode noise. Similarly, it is desirable that the resistors R1, R2 have approximately the same resistance.

Each series combination of transistor/resistor is connected in parallel between the current source 13 and the ground node VGND. The circuit nodes n1, n2 are used to drive the differential to single ended stage 210. Differential inputs IN_P, IN_N are applied to the gates of the transistors M9, M10. According to some embodiments of the invention, the differential inputs IN_P, IN_N may be USB 2.0 differential signals that have a voltage swing of approximately 100 mV, but the circuit 200 may of course be modified appropriately for other types of differential signals.

The buffer section 205 serves to amplify the input, to clean out common mode noise, and to establish good bias input level for the next stage. For example, when the differential inputs IN_P, IN_N are USB 2.0 differential signals, the differential buffer 205 may increase the 100 mV data up to approximately 500 mV, eliminate the common mode noise due to the matched components in each leg of the buffer, and establish a good common mode at circuit nodes n1 and n2 to drive into the differential to single ended amplifier section 210. In addition, the improved circuit provides enough drive current for the differential to single ended amplifier section 210.

The differential to single ended section 210 includes two well-matched standard differential-to-single-ended amplifiers 210a, 210b that are cross connected. Amplifier 210a includes current source I1 and four transistors M1, M2, M3, M4. In the embodiments illustrated in FIG. 2, transistors M1 and M2 are PMOS transistors and transistors M3 and M4 are NMOS transistors. Transistors M1 and M3 are serially connected, as are transistors M2 and M4, and each serial combination is attached in parallel between the supply voltage $V_{CC}$ and the current source I1. The gates of the PMOS transistors M1, M2 are commonly connected between the drain of transistor M1 and the source of transistor M3. The gates of transistors M3, M4 are connected to the circuit nodes n2, n1, respectively, of the buffer stage 205. Circuit node n4 is output from the amplifier 210a to drive the delay equalizing latch 215.

Amplifier 210b includes current source I2 and four transistors M5, M6, M7, M8. In the embodiments illustrated in FIG. 2, transistors M5 and M6 are PMOS transistors and transistors M7 and M8 are NMOS transistors. Transistors M5 and M7 are serially connected, as are transistors M6 and M8, and each serial combination is attached in parallel between the supply voltage $V_{CC}$ and the current source I1. The gates of the PMOS transistors M5, M6 are commonly connected between the drain of transistor M5 and the source of transistor M7. The gates of transistors M7, M8 are connected to the circuit nodes n1, n2, respectively, of the buffer stage 205. Circuit node n3 is output from the amplifier 210b to drive the delay equalizing latch 215.

The delay equalizing latch 215 includes inverters INV1, INV2, INV3, INV4, INV 5, and INV6. Circuit node n4 serves as input for the inverter INV1, while circuit node n3 serves as input for the inverter INV4. The inverters INV1, INV2, and INV3 are serially connected as are the inverters INV4, INV5, and INV6. Additionally, the output of inverter INV1, circuit node n5, is tied to the input of inverter INV6. Similarly, the output of inverter INV4, circuit node n6, is tied to the input of inverter INV3. The outputs of inverters INV3 and INV6 are the outputs OUT_H, OUT_L, respectively, of the improved level translator circuit 200. According to some embodiments of the invention, complementary CMOS outputs may be obtained from OUT_H and OUT_L.

According to embodiments of the invention, the inverter INV1 may be smaller than the inverter INV2. Likewise, the inverter INV4 may be smaller than the inverter INV5. In one exemplary embodiment, the inverters INV1 and INV4 are approximately half the size of the inverters INV2 and INV5, respectively. The reason for this size discrepancy is explained in the paragraphs that follow.

The operation of the improved level translator circuit 200 according to some embodiments of the invention will now be described with reference to FIGS. 2 and 3.

During operation of the improved level translator circuit 200, one of the two differential-to-single-ended amplifiers 210a, 210b is almost always producing a slower edge, whether it is rising or falling, than the other amplifier. That is, for either type of differential input transition (0-to-1 or 1-to-0), both a fast and a slow edge are generated by the two differential-to-single-ended amplifiers 210a, 210b.

The two differential-to-single-ended amplifiers 210a, 210b drive a delay equalizing latch 215 that can only be tripped when both of its inputs have opposite logic values. Because the inverter INV1 is smaller than the inverter INV2, and because the inverter INV4 is smaller than the inverter INV5, neither the inverter INV1 nor the inverter INV4 is strong enough to overpower the delay equalizing latch 215 by itself. The faster one of the circuit nodes n3 or n4 must wait for the slower node until the delay equalizing latch 215 can be flipped. The latch "waits" for the slow edge to arrive before the output is "released", and therefore, the delay is the same regardless of whether a 0-to-1 differential input transition or a 1-to-0 differential input transition has occurred.

Thus, the delay equalizing latch 215 always sets the total delay through the improved level translator circuit 200 to be the larger one of the 1-to-0 input transition and the 0-to-1 input transition. According to some embodiments of the invention, an improved level translator circuit designed in accordance with the principles described above is capable of operating in the gigahertz frequency range.

Table 1, which appears following the text of this paragraph, illustrates the switching operation of the delay equalizing latch 215 in response to the voltage levels appearing at the circuit nodes n5 and n6. Table 1 illustrates that the transition of circuit node n6 from logic 0 at time 0 to logic 1 at time 1 does not cause the output signals OUT_H and OUT_L to switch. It is not until time 2, when the circuit node n5 transitions from a logic 1 to a logic 0, that the outputs OUT_H and OUT_L will switch. In other words, the circuit nodes n5 and n6 must both "agree to be opposite" for the outputs OUT_H and OUT_L to switch.

TABLE 1

| Time | circuit node n5 | circuit node n6 | OUT_H | OUT_L |
|------|-----------------|-----------------|-------|-------|
| 0    | 1               | 0               | 1     | 0     |
| 1    | 1               | 1               | 1     | 0     |
| 2    | 0               | 1               | 0     | 1     |

In one preferred embodiment of the invention, the improved level translator circuit 200 may accurately translate 100 mV USB 2.0 differential signals applied at the inputs IN_P, IN_N into 1.8 V complementary CMOS signals at the outputs OUT_H, OUT_L. In this embodiment, the term "accurately" is interpreted as "pure delay", and the "pure delay" attempts to equalize four delay elements. For example, when a 50% hi/lo duty cycle differential signal is applied to the inputs IN_P, IN_N, a 50% hi/lo duty cycle signal appears at the outputs OUT_H, OUT_L.

Thus, the improved level translator circuit 200 may be used to turn a 100 mV voltage swing differential USB 2.0 data stream into complementary CMOS signals so that clock and data recovery (CDR) may be achieved using low power CMOS circuits.

According to other embodiments of the invention, the improved level translator circuit may also be used to translate 4 differential 480 MHz clock phases from a Phase Locked Loop-Clock Multiplication Unit (PLL-CMU) into complementary CMOS level signals. When all of these signals are translated to complementary-CMOS, low power CDR may be achieved.

Figure 3:
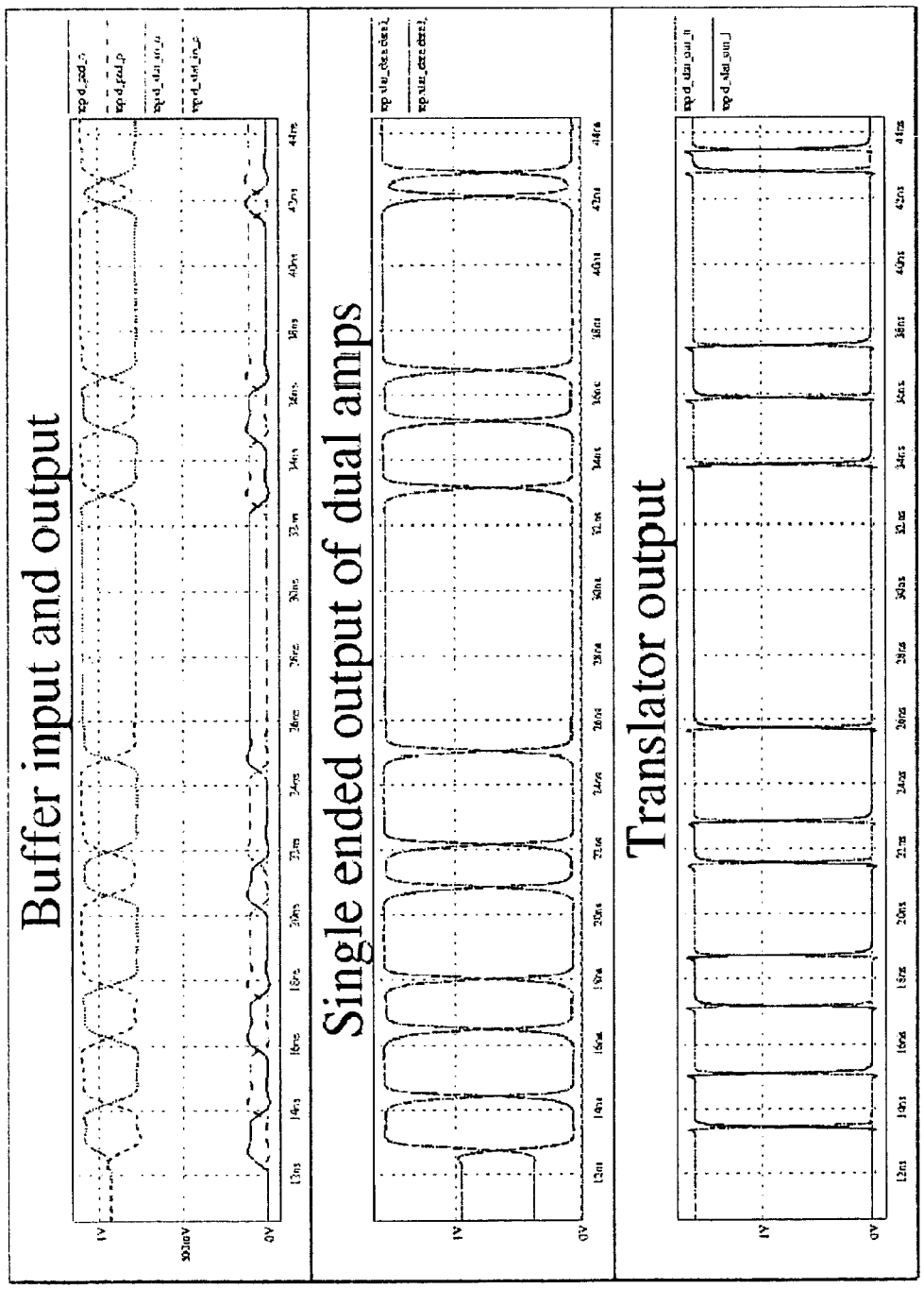
FIG. 3 is a waveform sample illustrating the operation of the improved level translator circuit of FIG. 2.
Figure 4:
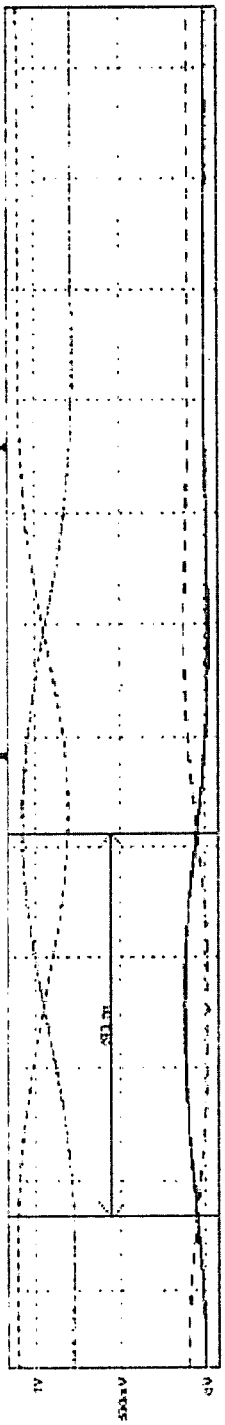
FIG. 4 is a waveform sample illustrating areas of FIG. 3 in finer detail.
Figure 4:
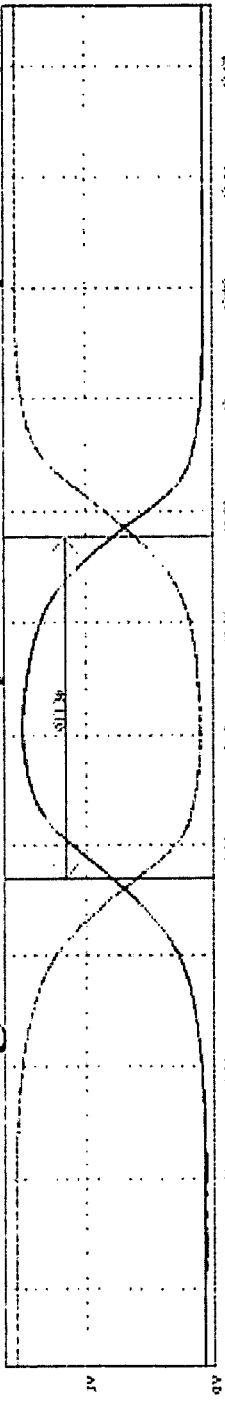
Figure 4:
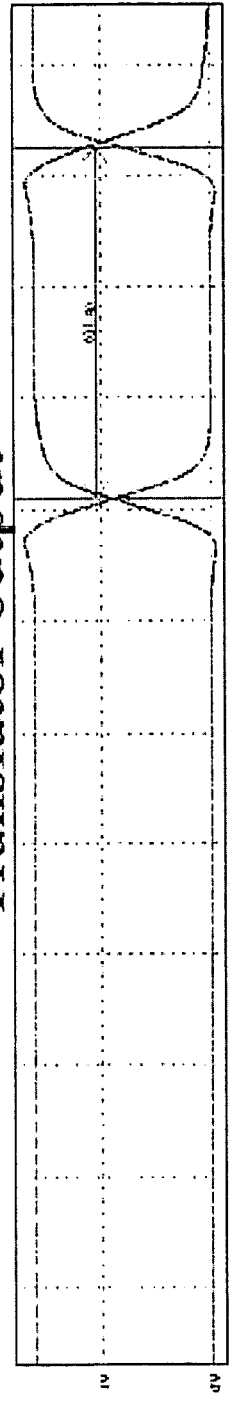

FIG. 3 presents waveform samples that illustrate the operation of the improved level translator circuit 200 of FIG. 2. FIG. 4 presents waveform samples that illustrate areas of FIG. 3 in finer detail.

FIGS. 3 and 4 illustrate that by always adding the slower one of the two input transition delays as described above, the translator output width (631 ps, FIG. 4) is not less than the buffer input width (590 ps, FIG. 4).

In alternative embodiments of the invention, an AC-coupled (for example a series capacitor) circuit could be used, but low transition density input signals may prove to be problematic. AC coupling can be used to translate a clock signal (having predictable transitions), but is much harder to use an AC coupled circuit to translate a data-stream (which has fewer transitions). AC-coupling is better with a higher frequency signal, as a series capacitor is a good conductor of higher frequencies. Unless performance degrading fail-safes are used, the output of an AC-coupled translator will tend to "flicker" if the input goes "quiet."

Advantages of the improved circuit and method include that it is phase accurate, i.e. there is a pure delay for both transitions, it has very low power consumption, and it is direct coupled to prevent possible problems with low transition rates. The output of a DC coupled amplifier (translator) is a linear mapping of the input, whereas an AC coupled amplifier will decay to its DC output level if there is no activity on the input.

The invention may be practiced in many ways. What follows are exemplary, non-limiting descriptions of some embodiments of the invention.

According to some embodiments of the invention, a circuit includes a first amplifier having a first output, a second amplifier having a second output, and a latch coupled to the first output and the second output, the latch configured to change an output state when a slower one of the first and second outputs arrives at the latch.

According to some embodiments, the circuit also includes a differential input buffer having outputs, wherein the outputs of the differential input buffer are coupled to the first amplifier and to the second amplifier.

According to some embodiments, the first amplifier includes a first differential-to-single-ended amplifier and the second amplifier includes a second differential-to-single-ended amplifier.

According to some embodiments, the first and second differential-to-single-ended amplifiers are cross-connected.

According to some embodiments, the first and second differential-to-single-ended amplifiers are well-matched.

According to some embodiments, the latch includes a first inverter coupled to the first output and a second inverter coupled to the first inverter, wherein the second inverter is larger than the first inverter.

According to some embodiments, the second inverter is approximately twice as large as the first inverter.

According to other embodiments of the invention, a level translator circuit includes a first stage configured to buffer a pair of differential inputs, a second stage coupled to the first stage and configured to output a rising edge and a falling edge in response to a transition in the pair of differential inputs, and a third stage coupled to the second stage and having a pair of outputs, the pair of outputs configured to switch states in response to the arrival of a slower one of the rising and falling edges.

According to some embodiments, the second stage of the level translator circuit consists of a first differential-to-single-ended amplifier and a second differential-to-single-ended amplifier.

According to some embodiments of the invention, the first differential-to-single-ended amplifier and the second differential-to-single-ended-amplifier are cross-connected.

According to some embodiments of the invention, the third stage of the level translator circuit includes a latch that is configured to be tripped only when both of its inputs have opposite logic values.

According to some embodiments, the latch includes a first inverter coupled to an output of the first differential-to-single-ended amplifier, a second inverter coupled to an output of the first inverter, a third inverter coupled to an output of the second differential-to-single-ended amplifier, and a fourth inverter coupled to an output of the third inverter.

According to some embodiments, the first and third inverters are smaller than the second and fourth inverters, respectively.

According to some embodiments, the first and third inverters are approximately half the size of the second and fourth inverters, respectively.

According to other embodiments of the invention, a method includes generating a first intermediate signal and a second intermediate signal in response to a transition of a pair of differential input signals, the first intermediate signal delayed with respect to the second intermediate signal, applying the first intermediate signal and the second intermediate signal as inputs to a latch, and switching an output of the latch only when the first intermediate signal and the second intermediate signal have opposite logic values.

According to some embodiments, generating the first intermediate signal and the second intermediate signal includes buffering the pair of differential input signals.

According to some embodiments, generating the first intermediate signal and the second intermediate signal further includes applying the buffered pair of differential input signals to a pair of differential-to-single-ended amplifiers.

According to some embodiments, generating the first intermediate signal and the second intermediate signal further includes applying the buffered pair of differential input signal to a pair of differential-to-single-ended amplifiers that are cross-connected.

According to some embodiments, applying the first intermediate signal and the second intermediate signal as inputs to a latch includes applying the first intermediate signal as an input to a first inverter that is smaller than a second inverter that is coupled to an output of the first inverter and applying the second intermediate signal as an input to a third inverter that is smaller than a fourth inverter that is coupled to an output of the third inverter.

According to some embodiments, the first inverter and the third inverter are approximately half as large as the second inverter and the fourth inverter, respectively.

It will be apparent that numerous slight modifications and adjustments may be made to the exemplary embodiments described above without departing from the inventive concepts taught by those embodiments. For example, it is well-known that a n-channel transistor may be replaced with a p-channel transistor, or vice versa, to achieve similar functionality.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit comprising:
    a first amplifier having a first output;
    a second amplifier having a second output; and
    a latch coupled to the first output and the second output, the latch configured to change an output state when a slower one of the first and second outputs arrives at the latch, the latch including
        a first inverter coupled to the first output, and
        a second inverter coupled to the first inverter, the second inverter larger than the first inverter.

2. The circuit of claim 1, further comprising a differential input buffer having outputs, wherein the outputs of the differential input buffer are coupled to the first amplifier and to the second amplifier.

3. The circuit of claim 2, the first amplifier comprising a first differential-to-single-ended amplifier and the second amplifier comprising a second differential-to-single-ended amplifier.

4. The circuit of claim 1, wherein the second inverter is approximately twice as large as the first inverter.

5. A level translator circuit comprising:
    a first stage configured to buffer a pair of differential inputs;
    a second stage coupled to the first stage and configured to output a rising edge and a falling edge in response to a transition in the pair of differential inputs, the second stage consisting of a first differential-to-single-ended amplifier and a second differential-to-single-ended amplifier; and
    a third stage coupled to the second stage and having a pair of outputs, the pair of outputs configured to switch states in response to the arrival of a slower one of the rising and falling edges, the third stage including a latch that is configured to be tripped only when both of its inputs have opposite logic values.

6. The level translator circuit of claim 5, the latch comprising:
    a first inverter coupled to an output of the first differential-to-single-ended amplifier;
    a second inverter coupled to an output of the first inverter;
    a third inverter coupled to an output of the second differential-to-single-ended amplifier;
    and a fourth inverter coupled to an output of the third inverter.

7. The level translator circuit of claim 6, wherein the first and third inverters are smaller than the second and fourth inverters, respectively.

8. The level translator circuit of claim 7, wherein the first and third inverters are approximately half the size of the second and fourth inverters, respectively.

9. A method comprising:
    generating a first intermediate signal and a second intermediate signal in response to a transition of a pair of differential input signals, the first intermediate signal delayed with respect to the second intermediate signal;
    applying the first intermediate signal and the second intermediate signal as inputs to a latch;
    switching an output of the latch only when the first intermediate signal and the second intermediate signal have opposite logic values.

10. The method of claim 9, wherein applying the first intermediate signal and the second intermediate signal as inputs to a latch comprises:
    applying the first intermediate signal as a input to a first inverter that is smaller than a second inverter that is coupled to an output of the first inverter; and
    applying the second intermediate signal as an input to a third inverter that is smaller than a fourth inverter that is coupled to a output of the third inverter.

11. The method of claim 10, wherein the first inverter and the third inverter are approximately half as large as the second inverter ad the fourth inverter, respectively.

12. The circuit of claim 1, the latch further comprising a third inverter, an output of the second inverter tied to an input of the third inverter.

13. The circuit of claim 12, the latch further comprising:
    a fourth inverter coupled to the second output;
    a fifth inverter coupled to the fourth inverter, the fifth inverter larger than the fourth inverter and
    a sixth inverter, an output of the fifth inverter tied to an input of the sixth inverter.

14. The circuit of claim 13, wherein an output of the first inverter is fed to the input of the sixth inverter, and wherein an output of the fourth inverter is connected to the input of the third inverter.

15. The level translator circuit of claim 6, the latch further comprising:
    a fifth inverter, an output of the second inverter driving an input of the fifth inverter; and a sixth inverter, an output of the fourth inverter driving an input of the sixth inverter.

16. The level translator circuit of claim 15, wherein an output of the first inverter drives the input of the sixth inverter, and wherein a output of the third inverter drives the input of the fifth inverter.

17. The method of claim 10, further comprising:
    applying the output of the first inverter to an input of a fifth inverter, the fifth inverter configured to produce a first output of the latch; and
    applying the output of the third inverter to an input of a sixth inverter, the sixth inverter configured to produce a second output of the latch, where the first and second outputs of the latch are differential outputs.

18. The method of claim 17, further comprising:
    applying an output of the second inverter to the input of the fifth inverter; and
    applying an output of the fourth inverter to the input of the sixth inverter.

19. The method of claim 9, wherein the second intermediate signal is the logical inverse of the first intermediate signal.

* * * * *